(12) United States Patent
Ishida et al.

(10) Patent No.: US 9,438,275 B2
(45) Date of Patent: Sep. 6, 2016

(54) TRANSMISSION APPARATUS AND TRANSMISSION METHOD

(71) Applicant: FUJITSU LIMITED, Kawasaki-shi, Kanagawa (JP)

(72) Inventors: Yuya Ishida, Kawasaki (JP); Hideaki Sugiya, Fujisawa (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 14/109,135

(22) Filed: Dec. 17, 2013

(65) Prior Publication Data
US 2014/0195873 A1 Jul. 10, 2014

(30) Foreign Application Priority Data

Jan. 10, 2013 (JP) ................. 2013-002975

(51) Int. Cl.
H03M 13/35 (2006.01)
H04L 1/00 (2006.01)
H03M 13/29 (2006.01)

(52) U.S. Cl.
CPC ......... *H03M 13/35* (2013.01); *H03M 13/2906* (2013.01); *H04L 1/0076* (2013.01)

(58) Field of Classification Search
CPC ............................ H03M 13/35; H04L 1/0076
See application file for complete search history.

(56) References Cited

U.S. PATENT DOCUMENTS

| 5,251,219 | A | * | 10/1993 | Babb | 714/755 |
| 5,369,652 | A | * | 11/1994 | Bailey et al. | 714/755 |
| 6,728,921 | B1 | * | 4/2004 | Bentall et al. | 714/758 |
| 6,965,636 | B1 | * | 11/2005 | DesJardins et al. | 375/219 |
| 7,075,944 | B1 | * | 7/2006 | Takagi | 370/470 |
| 7,243,296 | B2 | * | 7/2007 | Christensen | 714/800 |
| 2003/0123493 | A1 | | 7/2003 | Takahashi | |
| 2006/0184860 | A1 | * | 8/2006 | Takagi | 714/774 |

FOREIGN PATENT DOCUMENTS

JP 2003-188919 7/2003

* cited by examiner

Primary Examiner — Joseph D Torres
(74) Attorney, Agent, or Firm — Staas & Halsey LLP

(57) ABSTRACT

A transmission apparatus includes a mapping unit configured to map a first information associated with detecting an error of a frame into a payload area of the frame; and a transmission unit configured to transmit the frame including the first information and a second information associated with detecting an error of the frame.

10 Claims, 7 Drawing Sheets

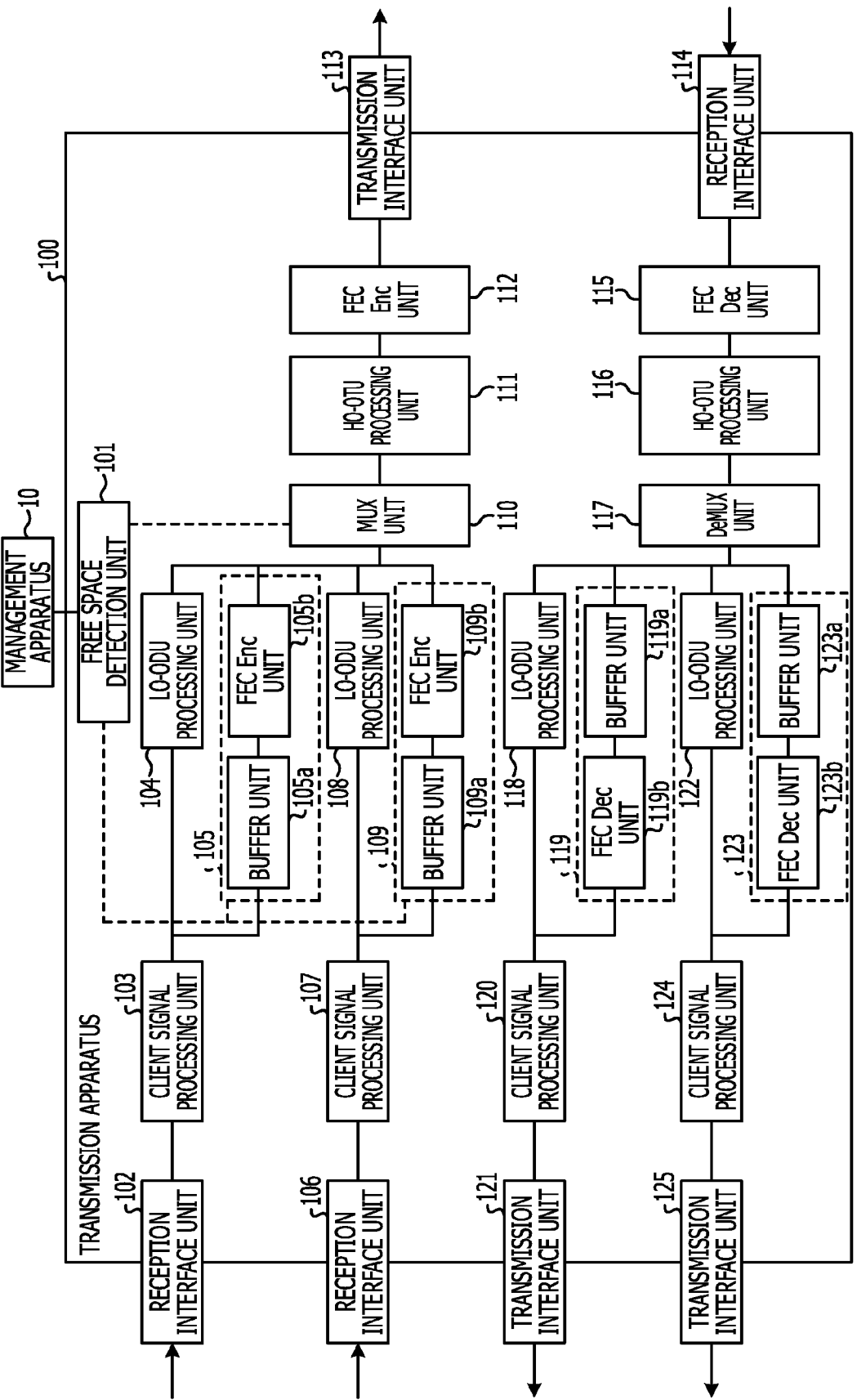

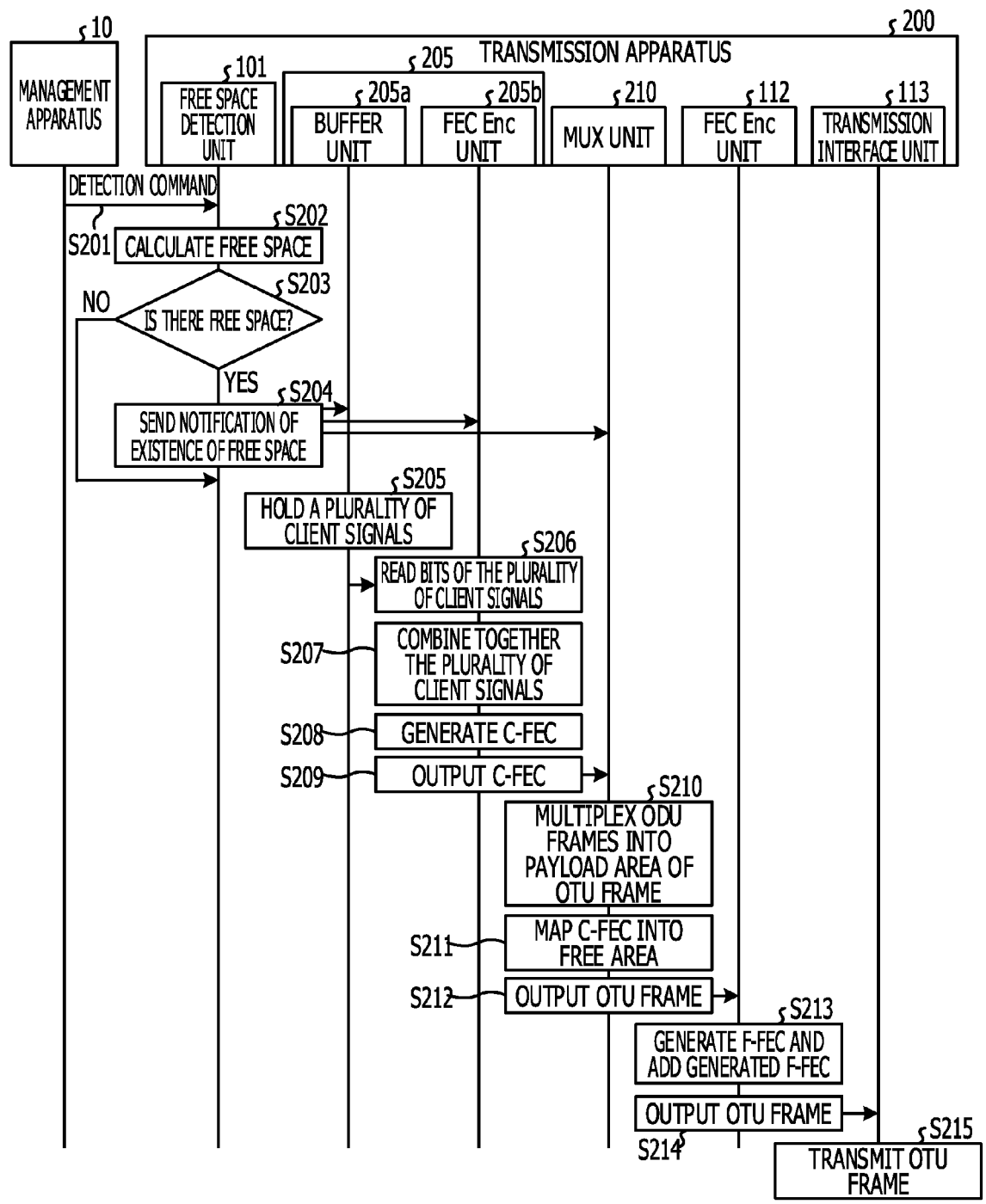

TRANSMISSION APPARATUS AND TRANSMISSION METHOD

CROSS-REFERENCE TO RELATED APPLICATION

This application is based upon and claims the benefit of priority from the prior Japanese Patent Application No. 2013-002975 filed on Jan. 10, 2013, the entire contents of which are incorporated herein by reference.

FIELD

The embodiments discussed herein are related to a transmission apparatus and a transmission method.

BACKGROUND

In recent years, an optical transmission system has been known in which a client signal output from a client apparatus is transmitted in the form of frames. A specific example of such a transmission method is an optical transport network (OTN) method that allows it to transparently transmit a client signal.

In a transmission apparatus using the OTN method, a client signal is mapped into a frame called an optical-channel data unit (ODU) frame, and ODU frames are multiplexed into a payload area of a frame called an optical-channel transport unit (OTU) frame. The transmission apparatus using the OTN method transmits the OTU frame including the ODU frames multiplexed in the payload area to a transmission apparatus on a receiving side. Hereinafter, an OTU frame including ODU frames multiplexed in a payload area thereof is referred to a multiplexed frame.

In an optical transmission system including a transmission apparatus using the OTN method, an increase in degradation of a multiplexed frame on a transmission line may occur with increasing transmission rate which is a tendency in recent years. In view of the above, various error correction algorithms have been investigated to correct an error of a degraded multiplexed frame. An example of such error correction algorithms is a forward error correction (FEC) algorithm. In the FEC algorithm, an FEC code, which is an error correction code to correct an error in a multiplexed frame to be transmitted to a receiving end, is added to the multiplexed frame, and the multiplexed frame with the added FEC code is transmitted to the receiving end. In the transmission apparatus on the receiving end, when the multiplexed frame with the FEC code added thereto is received, an error of the multiplexed frame is corrected using the FEC code added to the multiplexed frame. A description of related arts may be found, for example, in Japanese Laid-open Patent Publication No. 2003-188919.

However, in the related techniques, when a multiplexed frame with an added FEC code is transmitted, no consideration is given to suppression of an increase in transmission rate caused by implementation of the error correction capability.

That is, in the related techniques, an error of a multiplexed frame is corrected using only one FEC code added to the multiplexed frame. Therefore, it will be difficult to maintain a high error correction capability when a further increase occurs in transmission rate in the future.

In view of the above, a possible method of increasing the error correction capability may be to generate two error correction codes from a multiplexed frame and transmit the multiplexed frame together with the two FEC codes added thereto. However, in this method of transmitting a multiplexed frame together with two added FEC codes, the amount of information added to the multiplexed frame is twice greater, and thus the total transmission rate becomes higher than a standard value.

SUMMARY

According to an aspect of an embodiment, a transmission apparatus includes a mapping unit configured to map a first information associated with detecting an error of a frame into a payload area of the frame; and a transmission unit configured to transmit the frame including the first information and a second information associated with detecting an error of the frame.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 2 is a functional block diagram illustrating a configuration of a transmission apparatus according to the first embodiment.

FIG. 7 is a sequence diagram illustrating a flow of a process performed by a transmission apparatus according to the second embodiment.

DESCRIPTION OF EMBODIMENTS

Embodiments of a transmission apparatus and a transmission method are described in detail below with reference to drawings. Note that the embodiments are described below by way of example only but not limitation.

First Embodiment

Figure 1A:
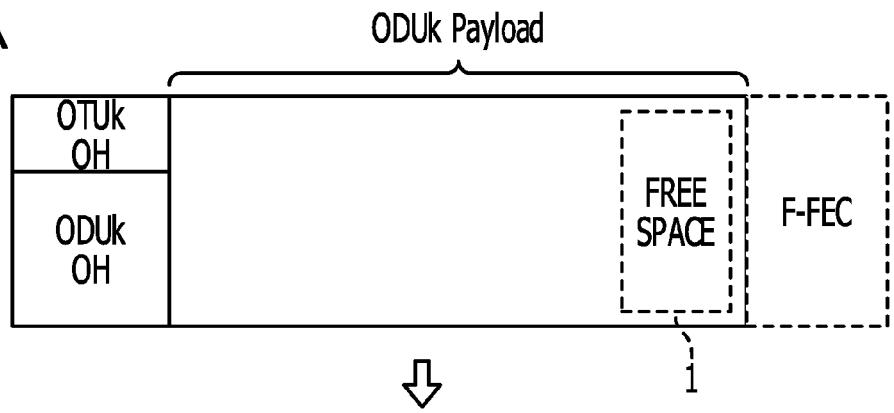
FIG. 1A, FIG. 1B, and FIG. 1C are diagrams for illustrating a transmission method executed by a transmission apparatus according to a first embodiment.
Figure 1B:
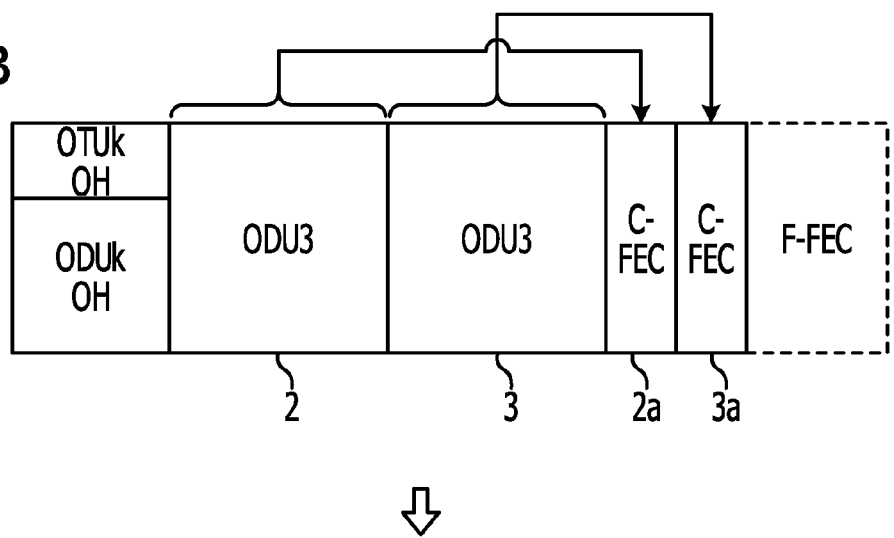
Figure 1C:
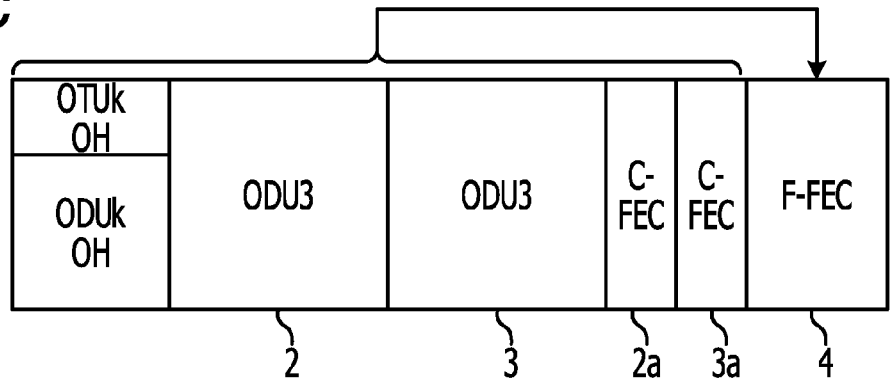

First, a transmission method employed by a transmission apparatus according to a first embodiment is described below. FIG. 1A, FIG. 1B, and FIG. 1C are diagrams for illustrating the transmission method employed by the transmission apparatus according to the first embodiment.

The transmission apparatus detects a free space remaining, without being occupied by an ODU frame, in a payload area of an OTU frame in which ODU frames including a client signal mapped therein are multiplexed. The ODU frame is an example of a first frame. The OTU frame is an example of a second frame. In the example illustrated in FIG. 1A, it is assumed that ODU frames, ODU3 frames 2 and 3, are multiplexed in a payload area ODUkPayload of an OTU frame, and a free space 1 remains in the payload area ODUkPayload without being occupied by the ODU3 frames 2 and 3, and thus the free space 1 is detected as a free space by the transmission apparatus. Here, let it be assumed by way of example that the transmission rate of OTU frames is 100 Gbits/s and the transmission rate of ODU3 frames is 40 Gbits/s. In this case, in a payload area ODUkPayload of an OTU frame, an area corresponding to 20 Gbit/s is detected by the transmission apparatus as the free space 1 which is not occupied by the ODU3 frames 2 and 3.

Subsequently, the transmission apparatus multiplexes ODU frames into the payload area of the OTU frame. In a case where a free space is detected as in the present example, an FEC code for use in correcting an error of a client signal is mapped in the free space by the transmission apparatus. Hereinafter, an FEC code for use in correcting an error of a client signal is referred to a C-FEC code. The C-FEC code is an example of a first error correction code. In the example illustrated in FIG. 1B, the transmission apparatus multiplexes ODU3 frames 2 and 3 into ODUkPayload of the OTU frame. In this specific example, the free space 1 has been detected, and thus transmission apparatus maps C-FEC codes 2a and 3a in the free space 1. The C-FEC codes 2a and 3a are error correction codes for use in correcting errors of client signals mapped in the respective ODU3 frames 2 and 3.

Thereafter, the transmission apparatus maps an FEC code for use in correcting an error of the OTU frame in which the ODU frames are multiplexed in the payload area and the C-FEC codes are mapped in the free space. Hereinafter, an FEC code for use in correcting an error of an OTU frame is referred to as an F-FEC code. The F-FEC code is an example of a second error correction code. When ODU frames are multiplexed in a payload area of an OTU frame and C-FEC codes are mapped in a free space, such an OTU frame is hereinafter referred to as a multiplexed frame. In the example illustrated in FIG. 1C, the transmission apparatus inserts an F-FEC code 4 in the multiplexed frame in which the ODU3 frames 2 and 3 are multiplexed in ODUkPayload and the C-FEC codes 2a and 3a are mapped in the free space 1. The F-FEC code 4 is an error correction code for use in correcting an error of a multiplexed frame.

Thereafter, the transmission apparatus transmits, to another transmission apparatus, the multiplexed frame including the C-FEC codes mapped in the free space and also including the F-FEC code. More specifically, for example, as illustrated in FIG. 1C, the transmission apparatus transmits, to another transmission apparatus, the OTU frame which is the multiplexed frame including the C-FEC codes 2a and 3a mapped in the free space 1 and also including the F-FEC code 4.

In the present embodiment, as described above, when there is a free space in a payload area of an OTU frame in which ODU frames are multiplexed, the transmission apparatus maps C-FEC codes in the free space and further adds an F-FEC code to the OTU frame including the C-FEC codes mapped in the free space. Thus, the OTU frame transmitted from the transmission apparatus to another transmission apparatus includes two types of error correction codes, that is, the C-FEC codes mapped in the free space of the payload area of the OTU frame, and the F-FEC code added to the OTU frame. Thus, the transmission apparatus according to the present embodiment has a better error correction capability than is provided by an error correction capability using only one FEC code according to the related techniques. Furthermore, in the transmission apparatus according to the present embodiment, an increase in an amount of information added to the OTU frame is smaller than the case in which a multiplexed frame with two FEC codes added thereto is transmitted. Therefore, in the transmission apparatus according to the present embodiment, it is allowed to enhance the error correction capability while suppressing the increase in transmission rate.

Next, a configuration of a transmission apparatus according to the first embodiment is described below. FIG. 2 is a functional block diagram illustrating a configuration of the transmission apparatus according to the first embodiment.

As illustrated in FIG. 2, the transmission apparatus 100 according to the present embodiment includes a free space detection unit 101, a reception interface unit 102, a client signal processing unit 103, a low order (LO)-ODU processing unit 104, and an FEC generation unit 105. The transmission apparatus 100 also includes a reception interface unit 106, a client signal processing unit 107, a LO-ODU processing unit 108, an FEC generation unit 109, a multiplexer (MUX) unit 110, and a high order (HO)-OTU processing unit 111. The transmission apparatus 100 further includes an FEC encoder 112 and a transmission interface unit 113.

The transmission apparatus 100 further includes a reception interface unit 114, an FEC decoder 115, a HO-OTU processing unit 116, a demultiplexer (DeMUX) unit 117, a LO-ODU processing unit 118, and an error correction unit 119. The transmission apparatus 100 further includes a client signal processing unit 120 and a transmission interface unit 121. The transmission apparatus 100 further includes a LO-ODU processing unit 122, an error correction unit 123, a client signal processing unit 124, and a transmission interface unit 125.

The free space detection unit 101 detects a free space, which is not occupied by an ODU frame, in a payload area of an OTU frame in which ODU frames including a mapped client signal are multiplexed. The free space is, for example, a fixed stuff (FS) byte area for mapping particular data. Detection of a free space includes detecting an amount of free space. More specifically, for example, the free space detection is performed as follows. The free space detection unit 101 accepts, from a management apparatus 10 configured to manage the transmission apparatus 100, an input of a detection command to detect a free space in a payload area of an OTU frame. The detection command input from the management apparatus 10 includes information indicating a transmission rate of ODU frames multiplexed in the payload area of the OTU frame. The free space detection unit 101 acquires, from the detection command, the transmission rate of ODU frames multiplexed in the payload area of the OTU frame, and calculates the free space by subtracting the acquired transmission rate of ODU frames from the transmission rate of the payload area of the OTU frame. When no free space is found in the payload area of the OTU frame, that is, when 0 is obtained as a result of the subtraction of the transmission rate of the ODU frame from the transmission rate of the payload area of the OTU frame, the free space detection unit 101 waits in operation. On the other hand, when a free space is found in the payload area of the OTU frame, that is, when a value other than 0 is obtained as the result of the subtraction, the free space detection unit 101 sends a detection notification to the FEC generation unit 105, the FEC generation unit 109, and the MUX unit 110 to notify that the free space has been detected.

The reception interface unit 102 is a receiver configured to receive a client signal from an adjacent client apparatus via an optical transmission line such as an optical fiber. The reception interface unit 102 converts the received client signal from an optical signal into an electric signal, and outputs the resultant client signal in the form of the electric signal to the client signal processing unit 103.

The client signal processing unit 103 accepts an input of the client signal from the reception interface unit 102. The client signal processing unit 103 transfers the client signal to the LO-ODU processing unit 104 and the FEC generation unit 105.

The client signal processing unit 103 determines the type of the client signal and outputs information indicating the determined type of client signal to the FEC generation unit 105.

The LO-ODU processing unit 104 accepts an input of the client signal from the client signal processing unit 103. The LO-ODU processing unit 104 maps the client signal into the ODU frame. The LO-ODU processing unit 104 outputs the ODU frame including the client signal mapped therein to the MUX unit 110.

The FEC generation unit 105 includes a buffer unit 105*a* and an FEC encoder 105*b*.

When the buffer unit 105*a* accepts, from the free space detection unit 101, an input of the detection notification indicating that the free space has been detected, the buffer unit 105*a* accepts, from the client signal processing unit 103, an input of the client signal and the information indicating the type of the client signal. The buffer unit 105*a* transfers the information indicating the type of the client signal to the FEC encoder 105*b*. The buffer unit 105*a* temporarily stores the client signal.

The FEC encoder 105*b* generates a C-FEC code using bits arranged in the client signal depending on the type of the client signal. More specifically, the FEC encoder 105*b* refers to the buffer unit 105*a* and generates the C-FEC code using bits arranged in a column direction of bits arranged in the client signal. The FEC encoder 105*b* is an example of the generation unit. The process of generating the C-FEC code by the FEC encoder 105*b* will be described in further detail later. The FEC encoder 105*b* outputs the generated C-FEC code to the MUX unit 110. The C-FEC code, generated using the bits arranged in the column direction among the bits arranged in the client signal, includes bits obtained by discontinuous bits arranged in the row direction which is a transmission direction of the client signal. In other words, the C-FEC code is an error correction code obtained by changing the order of bits originally arranged in the transmission direction of the client signal, that is, by interleaving the bits arranged in the transmission direction of the client signal. The C-FEC code produced in the above-described manner has a high error correction capability against burst errors in which a large number of errors occur intensively in a particular time period in the transmission direction of the signal.

In a case where the type of the client signal is a type specified in advance, the FEC encoder 105*b* stops generating the C-FEC code. More specifically, for example, in a case where the client signal is of a data type such as audio data that may not be high in transmission quality compared with image data, the FEC encoder 105*b* stops generating the C-FEC code.

The reception interface unit 106 receives the client signal from an adjacent client apparatus via the optical transmission line such as an optical fiber. The reception interface unit 106 outputs the received client signal to the client signal processing unit 107.

The client signal processing unit 107 accepts an input of the client signal from the reception interface unit 106. The client signal processing unit 107 transfers the client signal to the LO-ODU processing unit 108 and the FEC generation unit 109.

The client signal processing unit 107 determines the type of the client signal and outputs information indicating the determined type of client signal to the FEC generation unit 109.

The LO-ODU processing unit 108 accepts an input of the client signal from the client signal processing unit 107. The LO-ODU processing unit 108 maps the client signal into the ODU frame. The LO-ODU processing unit 108 outputs the ODU frame including the client signal mapped therein to the MUX unit 110.

In a case where a free space is found in the payload area of the OTU frame, the FEC generation unit 109 generates a C-FEC code using bits arranged in the client signal depending on the type of the client signal. More specifically, the FEC generation unit 109 includes a buffer unit 109*a* and an FEC encoder 109*b*.

When the buffer unit 109*a* accepts, from the free space detection unit 101, an input of the detection notification indicating that the free space has been detected, the buffer unit 109*a* accepts, from the client signal processing unit 107, an input of the client signal and the information indicating the type of the client signal. The buffer unit 109*a* transfers the information indicating the type of the client signal to the FEC encoder 109*b*. The buffer unit 109*a* temporarily stores the client signal.

The FEC encoder 109*b* generates a C-FEC code using bits arranged in the client signal depending on the type of the client signal. More specifically, the FEC encoder 109*b* refers to the buffer unit 109*a* and generates the C-FEC code using bits arranged in a column direction of bits arranged in the client signal. The FEC encoder 109*b* is an example of the generation unit. The FEC encoder 109*b* outputs the generated C-FEC code to the MUX unit 110.

In a case where the type of the client signal is a type specified in advance, the FEC encoder 109*b* stops generating the C-FEC code.

The MUX unit 110 accepts an input of the ODU frame from the LO-ODU processing unit 104 and the LO-ODU processing unit 108. The MUX unit 110 multiplexes the ODU frames into the payload area of the OTU frame. Herein, let it be assumed by way of example that the ODU frame input from the LO-ODU processing unit 104 is an ODU3 frame 2, and the ODU frame input from the LO-ODU processing unit 108 is an ODU3 frame 3. In this case, the MUX unit 110 multiplexes the ODU3 frames 2 and 3 into the payload area ODUkPayload of the OTU frame.

When a free space is found in the payload area of the OTU frame, the MUX unit 110 maps a C-FEC code for use in correcting an error of the client signal in the free space. More specifically, when the MUX unit 110 accepts, from the free space detection unit 101, an input of a detection notification indicating that the free space has been detected, the MUX unit 110 accepts inputs of C-FEC codes from the FEC encoder 105*b* and the FEC encoder 109*b*. The MUX unit 110 maps the C-FEC codes into the free space of the payload area of the OTU frame. The MUX unit 110 is an example of the mapping unit.

The MUX unit 110 outputs the OTU frame including the ODU frames multiplexed in the payload area and also including the C-FEC code mapped in the free space, that is, the multiplexed frame to the HO-OTU processing unit 111.

Figure 3:
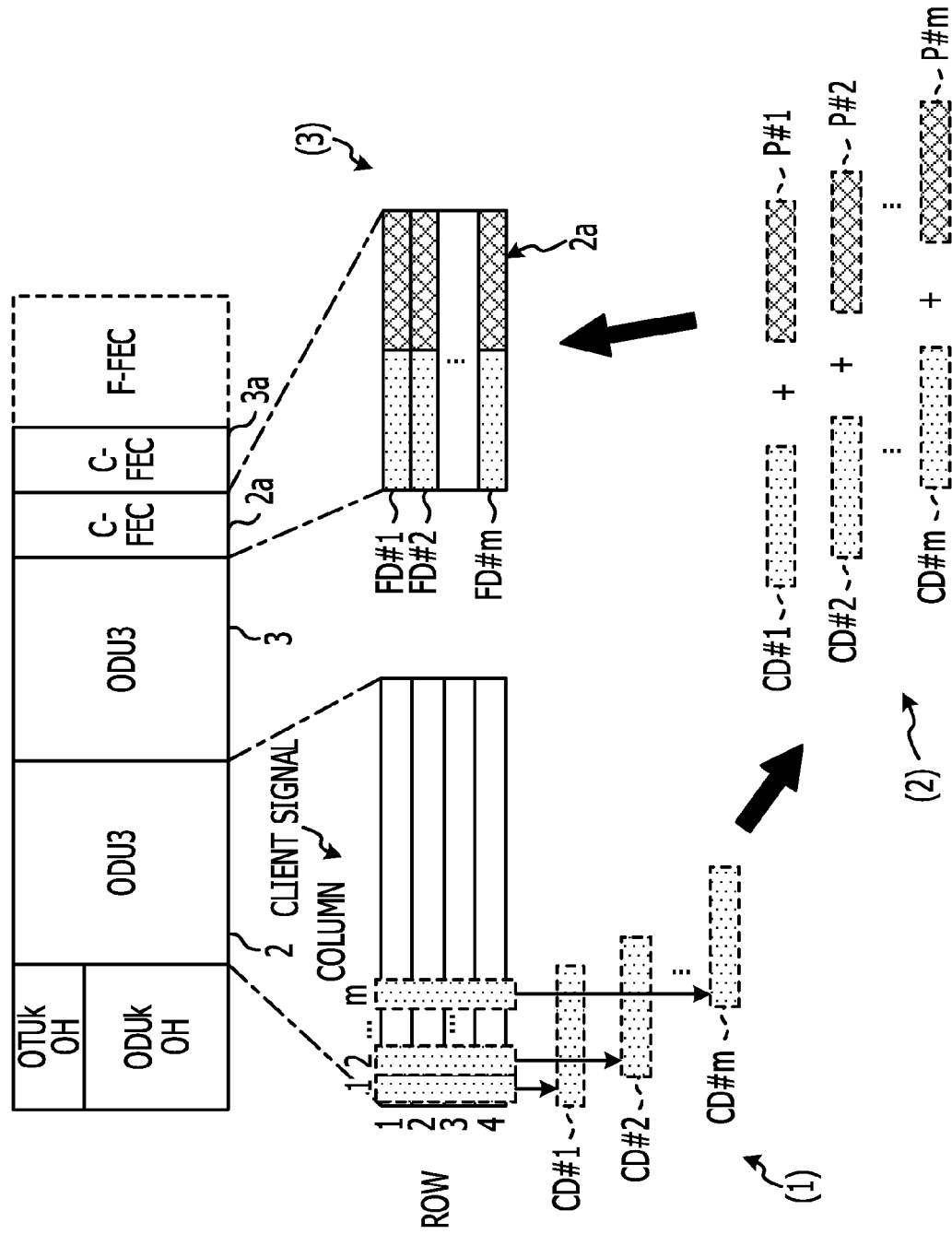
FIG. 3 is a diagram illustrating details of a process performed by an FEC generation unit and a MUX unit according to the first embodiment.

The process performed by the FEC generation unit 105 and the process performed by the MUX unit 110 are described in further detail below. FIG. 3 is a diagram illustrating details of the processes performed by the FEC generation unit and the MUX unit according to the first embodiment. In the example illustrated in FIG. 3, it is assumed by way of example that a payload area of an OTU frame has a free space. Furthermore, in the example illustrated in FIG. 3, it is also assumed by way of example that a client signal to be mapped into the ODU3 frame 2 is stored in the buffer unit 105a.

The FEC encoder 105b of the FEC generation unit 105 refers to the buffer unit 105a and reads out bits CD#1, CD#2, . . . , CD#m arranged in the column direction of the bits arranged in the client signal as illustrated in part (1) of FIG. 3. Note that m denotes an integer equal to or greater than 1.

Subsequently, as illustrated in part (2) of FIG. 3, the FEC encoder 105b adds parity bits P#1, P#2, . . . , P#m for use in parity check to respective bits CD#1, CD#2, . . . , CD#m thereby generating a C-FEC code 2a. More specifically, the FEC encoder 105b adds the parity bit P#1 to the bit CD#1 thereby generating data FD#1 in a first row of the C-FEC code 2a. Similarly, the FEC encoder 105b adds the parity bit P#2 to the bit CD#2 thereby generating data FD#2 in a second row of the C-FEC code 2a. The FEC encoder 105b adds the parity bit P#m to the bit CD#m thereby generating data FD#m in an m-th row of the C-FEC code 2a. The FEC encoder 105b outputs the generated C-FEC code 2a to the MUX unit 110.

In this specific case, the MUX unit 110 then accepts, from the free space detection unit 101, an input of a detection notification indicating that the free space has been detected, and the MUX unit 110 accepts an input of the C-FEC code 2a from the FEC encoder 105b. The MUX unit 110 maps the C-FEC code 2a in the free space in the payload area of the OTU frame as illustrated part (3) of FIG. 3.

Referring again to FIG. 2, the HO-OTU processing unit 111 accepts an input of the multiplexed frame from the MUX unit 110. The HO-OTU processing unit 111 maps various kinds of operational information and the like in an overhead (OH) area of the multiplexed frame. The HO-OTU processing unit 111 outputs the multiplexed frame including the various kinds of operational information and the like mapped in the OH area to the FEC encoder 112.

The FEC encoder 112 accepts an input of the multiplexed frame from the HO-OTU processing unit 111. The FEC encoder 112 adds an F-FEC code for use in correcting an error of the multiplexed frame to the multiplexed frame. More specifically, the FEC encoder 112 generates the F-FEC code using bits arranged in a row direction perpendicular to the column direction of bits arranged in the multiplexed frame, and the FEC encoder 112 adds the generated F-FEC code to the multiplexed frame. The FEC encoder 112 is an example of the addition unit. The process of adding the F-FEC code by the FEC encoder 112 will be described in further detail later. The FEC encoder 112 outputs, to the transmission interface unit 113, the multiplexed frame including the C-FEC code mapped in the free space of the payload area and the added F-FEC code.

In a case where the FEC encoder 112 receives a command to stop generating the F-FEC code from an external apparatus such as the management apparatus 10 or an input unit (not illustrated) or the like, the FEC encoder 112 stops generating the F-FEC code.

Figure 4:
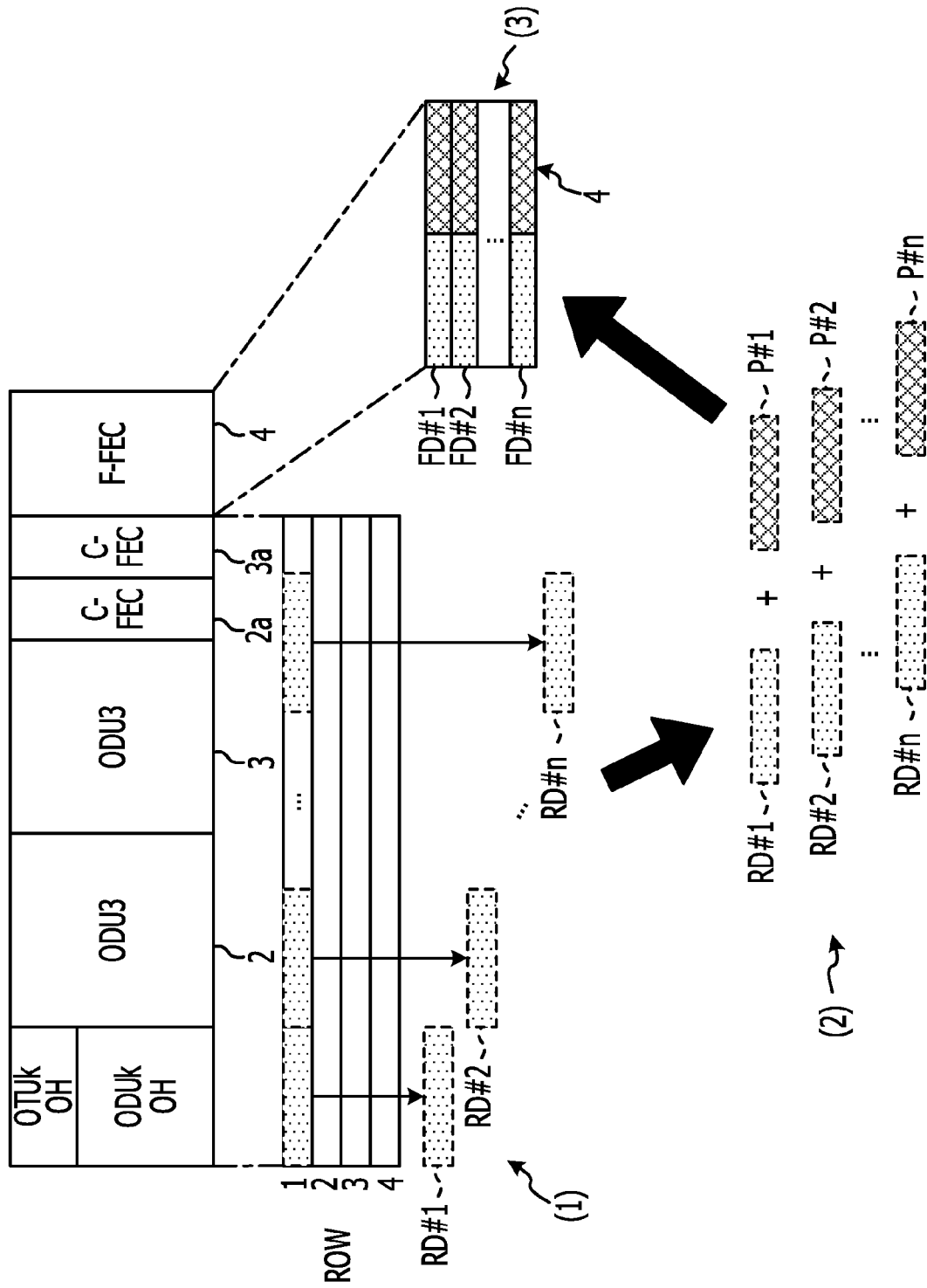
FIG. 4 is a diagram illustrating details of a process performed by an FEC encoder according to the first embodiment.

The process performed by the FEC encoder 112 is described in further detail below. FIG. 4 is a diagram illustrating the details of the process performed by the FEC encoder according to the first embodiment. In the example illustrated in FIG. 4, it is assumed that the FEC encoder 112 has accepted an input, from the HO-OTU processing unit 111, of a multiplexed frame including ODU3 frames 2 and 3 multiplexed in a payload area and C-FEC codes 2a and 3a mapped in a free space of the payload area.

The FEC encoder 112 reads out bits RD#1, RD#2, . . . , RD#n arranged in the row direction of the bits arranged in the multiplexed frame as illustrated in part (1) of FIG. 4. Note that n denotes an integer equal to or greater than 1.

Subsequently, as illustrated in part (2) of FIG. 4, the FEC encoder 112 adds parity bits P#1, P#2, . . . , P#n for use in parity check to respective bits RD#1, RD#2, . . . , RD#n thereby generating an F-FEC code 4. More specifically, the FEC encoder 112 adds the parity bit P#1 to the bit RD#1 thereby generating data FD#1 in a first row of the F-FEC code 4. Similarly, the FEC encoder 112 adds the parity bit P#2 to the bit RD#2 thereby generating data FD#2 in a second row of the F-FEC code 4. The FEC encoder 112 adds the parity bit P#n to the bit RD#n thereby generating data FD#n in an n-th row of the F-FEC code 4.

Subsequently, as illustrated in part (3) of FIG. 4, the FEC encoder 112 adds the generated F-FEC code 4 to the multiplexed frame.

Referring again to FIG. 2, the transmission interface unit 113 receives an input, from the FEC encoder 112, of the multiplexed frame including the C-FEC codes mapped in the free space of the payload area and also including the F-FEC code. The transmission interface unit 113 converts the multiplexed frame, including the C-FEC codes mapped in the free space of the payload area and also including the F-FEC code, from an electric signal into an optical signal. The transmission interface unit 113 transmits the resultant converted multiplexed frame to an adjacent transmission apparatus via the optical transmission line such as an optical fiber.

The reception interface unit 114 receives the multiplexed frame including the C-FEC codes mapped in the free space of the payload area and also including the F-FEC code from the adjacent transmission apparatus via the optical transmission line such as an optical fiber. The reception interface unit 114 converts the received multiplexed frame from an optical signal into an electric signal, and the reception interface unit 114 transmits the resultant converted multiplexed frame to the FEC decoder 115.

The FEC decoder 115 accepts an input of the multiplexed frame from the reception interface unit 114. The FEC decoder 115 decodes the F-FEC code added to the multiplexed frame, and the FEC decoder 115 corrects an error of the multiplexed frame by using the decoded F-FEC code. The FEC decoder 115 is an example of a first correction unit. After the FEC decoder 115 corrects the error of the multiplexed frame, the FEC decoder 115 outputs the resultant multiplexed frame to the HO-OTU processing unit 116.

The HO-OTU processing unit 116 accepts an input of the multiplexed frame from the FEC decoder 115. The OTU processing unit 116 extracts the various kinds of operational information and the like from an OH area of the multiplexed frame. The OTU processing unit 116 performs a particular process according to the extracted various kinds of operational information and the like. The OTU processing unit 116 outputs the multiplexed frame to the DeMUX unit 117.

The DeMUX unit 117 accepts an input of the multiplexed frame from the HO-OTU processing unit 116. The DeMUX unit 117 separates the C-FEC codes and the ODU frames from the multiplexed frame. The DeMUX unit 117 is an example of the separation unit. The DeMUX unit 117 outputs the C-FEC codes separated from the multiplexed frame to the error correction unit 119 and the error correction unit 123. Furthermore, the DeMUX unit 117 outputs the ODU frames to the LO-ODU processing unit 118 and the LO-ODU processing unit 122. Here, let it be assumed by way of example that ODU3 frames 2 and 3 are multiplexed in the payload area of the multiplexed frame input from the HO-OTU processing unit 116, and C-FEC codes 2*a* and 3*a* are mapped in the free space of the payload area. In this case, the DeMUX unit 117 separates C-FEC codes 2*a* and 3*a* and the ODU3 frames 2 and 3 from the multiplexed frame. The DeMUX unit 117 outputs the C-FEC code 2*a* separated from the multiplexed frame to the error correction unit 119. The DeMUX unit 117 outputs the ODU3 frame 2 to the LO-ODU processing unit 118. The DeMUX unit 117 outputs the C-FEC code 3*a* separated from the multiplexed frame to the error correction unit 123. The DeMUX unit 117 outputs the ODU3 frame 3 to the LO-ODU processing unit 122.

The LO-ODU processing unit 118 accepts an input of the ODU frame from the DeMUX unit 117. The LO-ODU processing unit 118 demaps (extracts) the client signal from the ODU frame. The LO-ODU processing unit 118 outputs the extracted client signal to the client signal processing unit 120.

The error correction unit 119 includes a buffer unit 119*a* and an FEC decoder 119*b*.

The buffer unit 119*a* accepts an input of the C-FEC code from the DeMUX unit 117. The buffer unit 119*a* temporarily stores the accepted C-FEC code.

The FEC decoder 119*b* refers to the buffer unit 119*a* and decodes the C-FEC code. The FEC decoder 119*b* corrects an error of the client signal input to the client signal processing unit 120 by using the decoded C-FEC code. The FEC decoder 119*b* is an example of the second correction unit.

The client signal processing unit 120 accepts an input of the client signal from the LO-ODU processing unit 118. Note that the client signal input from the client signal processing unit 120 is the client signal whose error has been corrected by the FEC decoder 119*b*. The client signal processing unit 120 outputs the client signal to the transmission interface unit 121.

The transmission interface unit 121 accepts an input of the client signal from the client signal processing unit 120. The transmission interface unit 121 converts the client signal from an electric signal to an optical signal. The transmission interface unit 121 transmits the resultant converted client signal to an adjacent transmission apparatus via the optical transmission line such as an optical fiber.

The LO-ODU processing unit 122 accepts an input of the ODU frame from the DeMUX unit 117. The LO-ODU processing unit 122 demaps (extracts) the client signal from the ODU frame. The LO-ODU processing unit 122 outputs the extracted client signal to the client signal processing unit 124.

The error correction unit 123 includes a buffer unit 123*a* and an FEC decoder 123*b*.

The buffer unit 123*a* accepts an input of the C-FEC code from the DeMUX unit 117. The buffer unit 123*a* temporarily stores the accepted C-FEC code.

The FEC decoder 123*b* refers to the buffer unit 123*a* and decodes the C-FEC code. The FEC decoder 123*b* corrects an error of the client signal input to the client signal processing unit 124 by using the decoded C-FEC code. The FEC decoder 123*b* is an example of the second correction unit.

The client signal processing unit 124 accepts an input of the client signal from the LO-ODU processing unit 122. Note that the client signal input from the client signal processing unit 124 is the client signal whose error has been corrected by the FEC decoder 123*b*. The client signal processing unit 124 outputs the client signal to the transmission interface unit 125.

The transmission interface unit 125 accepts an input of the client signal from the client signal processing unit 124. The transmission interface unit 125 converts the client signal from an electric signal to an optical signal. The transmission interface unit 125 transmits the resultant converted client signal to the adjacent transmission apparatus via the optical transmission line such as an optical fiber.

Figure 5:
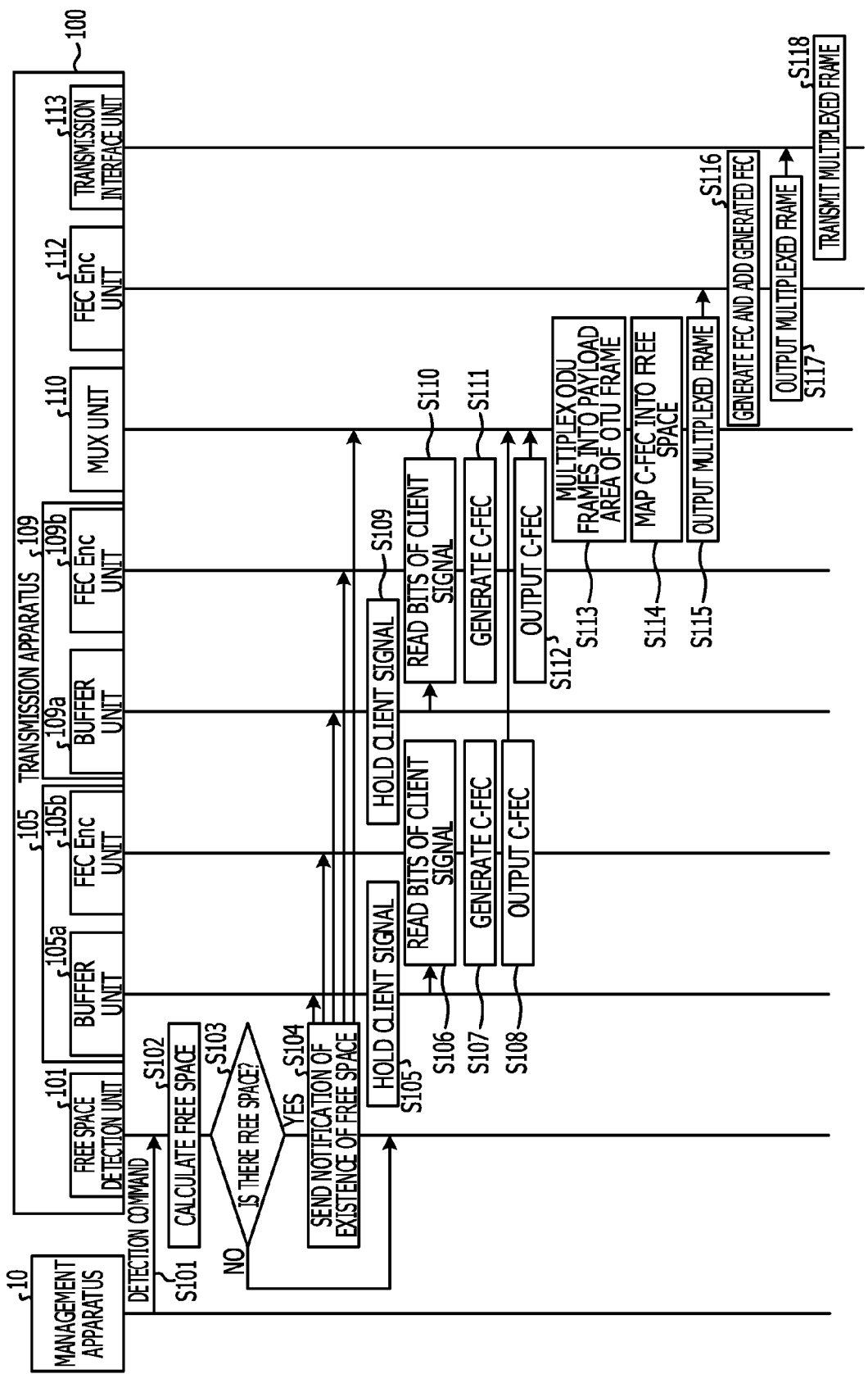
FIG. 5 is a sequence diagram illustrating a flow of a process performed by a transmission apparatus according to the first embodiment.

Next, the process performed by the transmission apparatus 100 according to the first embodiment is described below. FIG. 5 is a sequence diagram illustrating a flow of the process performed by the transmission apparatus according to the first embodiment.

As illustrated in FIG. 5, the free space detection unit 101 of the transmission apparatus 100 accepts an input of a detection command from the management apparatus 10 (S101). The free space detection unit 101 acquires the transmission rate of the ODU frames from the detection command. The free space detection unit 101 calculates the free space by subtracting the acquired transmission rate of ODU frames from the transmission rate of the payload area of the OTU frame (S102). When no free space is found in the payload area of the OTU frame (the answer to S103 is No), the free space detection unit 101 waits.

On the other hand, when a free space is found in the payload area of the OTU frame (the answer to S103 is Yes), the free space detection unit 101 sends a detection notification to the FEC generation unit 105, an FEC generation unit 109, and the MUX unit 110 to notify that the free space has been detected (S104).

When the buffer unit 105*a* of the FEC generation unit 105 accepts an input of the detection notification from the free space detection unit 101, the buffer unit 105*a* transfers the information indicating the type of the client signal to the FEC encoder 105*b*, and the buffer unit 105*a* temporarily stores the client signal (S105).

When the FEC encoder 105*b* accepts an input of the detection notification from the free space detection unit 101, the FEC encoder 105*b* refers to the buffer unit 105*a* and reads out bits arranged in the column direction of the bits arranged in the client signal (S106).

Thereafter, the FEC encoder 105*b* adds parity bits to the respective read bits thereby generating a C-FEC code (S107). The FEC encoder 105*b* outputs the generated C-FEC code to the MUX unit 110. (S108).

When the buffer unit 109*a* of the FEC generation unit 109 accepts an input of the detection notification from the free space detection unit 101, the buffer unit 109*a* transfers the information indicating the type of the client signal to the FEC encoder 109*b*, and the buffer unit 109*a* temporarily stores the client signal (S109).

The FEC encoder 109*b* accepts an input of the detection notification from the free space detection unit 101, refers to the buffer unit 109*a* and reads out bits arranged in the column direction of the bits arranged in the client signal (S110).

Thereafter, the FEC encoder 109*b* adds parity bits to the respective read bits thereby generating a C-FEC code (S111). The FEC encoder 109*b* outputs the generated C-FEC code to the MUX unit 110 (S112).

When the MUX unit 110 accepts an input of the detection notification from the free space detection unit 101, the MUX unit 110 accepts inputs of the C-FEC codes from the FEC encoder 105*b* and the FEC encoder 109*b*. The MUX unit 110 multiplexes ODU frames into the payload area of the OTU frame (S113). The MUX unit 110 maps the C-FEC codes into the free space of the payload area of the OTU frame (S114).

The MUX unit 110 outputs the OTU frame including the ODU frame multiplexed in the payload area and also including the C-FEC codes mapped in the free space, that is, the multiplexed frame to the FEC encoder 112 via the HO-OTU processing unit 111 (S115).

The FEC encoder 112 generates an F-FEC code using bits arranged in a row direction of bits arranged in the multiplexed frame, and the FEC encoder 112 adds the generated F-FEC code to the multiplexed frame (S116). The FEC encoder 112 outputs the multiplexed frame, including the C-FEC codes mapped in the free space of the payload area and also including the added F-FEC code, to the transmission interface unit 113 (S117).

The transmission interface unit 113 converts the multiplexed frame, including the C-FEC codes mapped in the free space of the payload area and also including the F-FEC code, from an electric signal into an optical signal. The transmission interface unit 113 transmits the resultant converted multiplexed frame to the adjacent transmission apparatus (S118).

As described above, in the transmission apparatus 100 according to the first embodiment, when there is a free space in a payload area of an OTU frame in which ODU frames are multiplexed, C-FEC codes are mapped in the free space and furthermore an F-FEC code is added to the OTU frame including the C-FEC codes mapped in the free space. Thus, the OTU frame transmitted from the transmission apparatus 100 to the adjacent may include two types of error correction codes, that is, the C-FEC codes mapped in the free space of the payload area of the OTU frame, and the F-FEC code added to the OTU frame. Therefore, the transmission apparatus 100 according to the first embodiment may have an improved error correction capability compared with the error correction capability using one FEC code according to the related techniques. Furthermore, in the transmission apparatus 100 according to the present embodiment, an increase in an amount of information added to the OTU frame is suppressed compared with the method in which two FEC codes are added to a transmitted multiplexed frame. That is, the transmission apparatus according to the present embodiment is capable of achieving an improvement in error correction capability while suppressing an increase in transmission rate.

In the transmission apparatus 100 according to the first embodiment, when a payload area of an OTU frame has a free space, a C-FEC code is generated using bits arranged in a client signal depending on the type of the client signal, and the generated C-FEC code is mapped in the free space. Thus, in the transmission apparatus 100 according to the present embodiment, it is allowed to correct errors using the C-FEC code that may be different depending on the type of the client signal, which allows a further improvement in the error correction capability.

In the transmission apparatus 100 according to the first embodiment, when a client signal has a particular type specified in advance, generating of the C-FEC code is stopped. That is, in the transmission apparatus 100 according to the present embodiment, when the client signal has a particular data type for which latency is more importance than the signal quality, the generation of the C-FEC code may be selectively stopped.

In the transmission apparatus 100 according to the first embodiment, among bits arranged in a client signal, bits arranged in the column direction are used in generating the C-FEC code. Furthermore, in the transmission apparatus 100 according to the first embodiment, among bits arranged in an OTU frame, bits arranged in the row direction are used in generating the F-FEC code. Therefore, in the transmission apparatus 100 according to the present embodiment, in addition to the F-FEC code obtained using the bits arranged in the row direction which is a transmission direction of the signal, the C-FEC code obtained by interleaving the bits arranged in the row direction may be used in error correction. Thus, the transmission apparatus 100 according to the present embodiment has a high error correction capability against burst errors in which a large number of errors occur intensively in a particular time period in the transmission direction of the signal.

In the transmission apparatus 100 according to the first embodiment, when a command to stop generating the F-FEC code is received from an external apparatus, the input unit, or the like, then generating the F-FEC code is stopped. That is, according to the present embodiment, the transmission apparatus 100 is capable of selectively stopping the generation of the F-FEC code.

Second Embodiment

Figure 6:
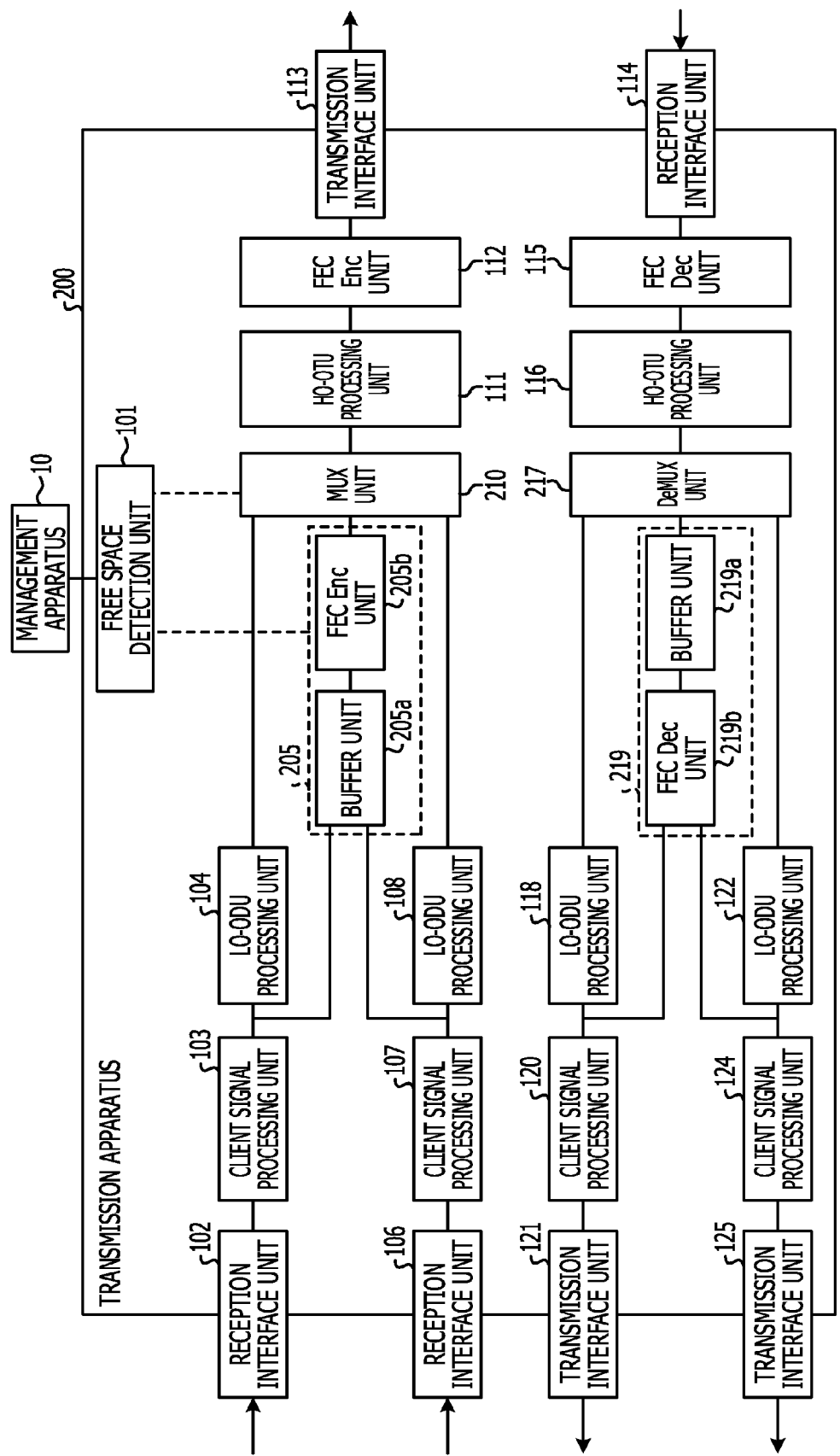
FIG. 6 is a functional block diagram illustrating a configuration of a transmission apparatus according to a second embodiment.

FIG. 6 is a functional block diagram illustrating a configuration of a transmission apparatus according to a second embodiment. The transmission apparatus according to the second embodiment is different from the first embodiment in a method of generating a C-FEC code used in correcting an error of a client signal. A description of units and operations thereof similar to those according to the first embodiment is omitted.

A transmission apparatus 200 according to the present embodiment includes, as illustrated in FIG. 6, a free space detection unit 101, a reception interface unit 102, a client signal processing unit 103, a LO-ODU processing unit 104, and an FEC generation unit 205. The transmission apparatus 200 further includes, a reception interface unit 106, a client signal processing unit 107, a LO-ODU processing unit 108, a MUX unit 210, and a HO-OTU processing unit 111. The transmission apparatus 200 further includes an FEC encoder 112 and a transmission interface unit 113.

The transmission apparatus 200 further includes a reception interface unit 114, an FEC decoder 115, a HO-OTU processing unit 116, a DeMUX unit 217, the LO-ODU processing unit 118 and, an error correction unit 219. The transmission apparatus 200 further includes a client signal processing unit 120 and a transmission interface unit 121. The transmission apparatus 200 further includes a LO-ODU processing unit 122, a client signal processing unit 124, and a transmission interface unit 125.

Of these units, the free space detection unit 101, the reception interface unit 102, and the client signal processing unit 103 respectively correspond to the free space detection unit 101 the reception interface unit 102, and the client signal processing unit 103 illustrated in FIG. 2. Furthermore, the LO-ODU processing unit 104, the reception interface unit 106, and the client signal processing unit 107 respectively correspond to the LO-ODU processing unit 104, the reception interface unit 106, and the client signal processing unit 107 illustrated in FIG. 2. The LO-ODU processing unit 108 and the HO-OTU processing unit 111 respectively correspond to the LO-ODU processing unit 108 and the HO-OTU processing unit 111 illustrated in FIG. 2. The FEC encoder 112 and the transmission interface unit 113 respectively correspond to the FEC encoder 112 and the transmission interface unit 113 illustrated in FIG. 2. The reception interface unit 114, the FEC decoder 115, and the HO-OTU processing unit 116 respectively correspond to the reception interface unit 114, the FEC decoder 115, and the HO-OTU processing unit 116 illustrated in FIG. 2. The LO-ODU processing unit 118, the client signal processing unit 120, and the transmission interface unit 121 respectively correspond to the LO-ODU processing unit 118, the client signal processing unit 120, and the transmission interface unit 121 illustrated in FIG. 2. The LO-ODU processing unit 122, the client signal processing unit 124, and the transmission interface unit 125 respectively correspond to the LO-ODU processing unit 122, the client signal processing unit 124, and the transmission interface unit 125 illustrated in FIG. 2.

In the present embodiment, when the free space detection unit 101 detects a free space in a payload area of an OTU frame, the free space detection unit 101 sends a detection notification to the FEC generation unit 205 and the MUX unit 210 to notify that the free space has been detected.

In the present embodiment, the client signal processing unit 103 accepts an input of a client signal from the reception interface unit 102, and transfers the client signal to the LO-ODU processing unit 104 and the FEC generation unit 205.

The client signal processing unit 107 according to the present embodiment accepts an input of the client signal from the reception interface unit 106, and transfers the client signal to the LO-ODU processing unit 108 and the FEC generation unit 205.

The FEC generation unit 205 includes a buffer unit 205a and an FEC encoder 205b.

When the buffer unit 205a accepts, from the free space detection unit 101, an input of the detection notification indicating that the free space has been detected, the buffer unit 205a accepts an input of a client signal from the client signal processing unit 103, and from the client signal processing unit 107. The buffer unit 205a temporarily stores the accepted two client signals.

The FEC encoder 205b combines together a plurality of client signals, and generates a C-FEC code using bits arranged in a signal obtained by combining together the plurality of client signals. More specifically, the FEC encoder 205b refers to the buffer unit 205a, and reads out the two client signals stored individually and combines together the read two client signals. The FEC encoder 205b generates a C-FEC code using bits arranged in a column direction of bits arranged in an integrated signal obtained by combining together the two client signal. The FEC encoder 205b is an example of the generation unit. The FEC encoder 205b outputs the generated C-FEC code to the MUX unit 210.

The MUX unit 210 accepts an input of an ODU frame from the LO-ODU processing unit 104 and the LO-ODU processing unit 108. The MUX unit 210 multiplexes the ODU frames into a payload area of an OTU frame. Here, let it be assumed by way of example that the ODU frame input from the LO-ODU processing unit 104 is an ODU3 frame 2, and the ODU frame input from the LO-ODU processing unit 108 is an ODU3 frame 3. In this case, the MUX unit 210 multiplexes the ODU3 frames 2 and 3 into the payload area ODUkPayload of the OTU frame.

When a free space is detected in the payload area of the OTU frame, the MUX unit 210 maps the C-FEC code in the free space. More specifically, when the MUX unit 210 accepts, from the free space detection unit 101, an input of a detection notification indicating that the free space has been detected, the MUX unit 210 accepts an input of the C-FEC code from the FEC encoder 205b, and maps the C-FEC code into the free space of the payload area of the OTU frame. The MUX unit 210 is an example of the mapping unit.

The MUX unit 210 outputs the OTU frame including the ODU frames multiplexed in the payload area and also including the C-FEC code mapped in the free space, that is, the multiplexed frame to the HO-OTU processing unit 111.

In the present embodiment, the HO-OTU processing unit 116 accepts an input of the multiplexed frame from the FEC decoder 115. The OTU processing unit 116 extracts various kinds of operational information and the like from an OH area of the multiplexed frame, and performs a particular process according to the extracted various kinds of operational information and the like. The OTU processing unit 116 outputs the multiplexed frame to the DeMUX unit 217.

The DeMUX unit 217 accepts an input of the multiplexed frame from the HO-OTU processing unit 116. The DeMUX unit 217 separates the C-FEC code and the ODU frames from the multiplexed frame. The DeMUX unit 217 is an example of the separation unit. The DeMUX unit 217 outputs the C-FEC codes separated from the multiplexed frame to the error correction unit 219. The DeMUX unit 217 outputs the ODU frames to the LO-ODU processing unit 118, and the LO-ODU processing unit 122.

The LO-ODU processing unit 118 according to the present embodiment accepts an input of the ODU frame from the DeMUX unit 217. The LO-ODU processing unit 118 demaps (extracts) the client signal from the ODU frame. The LO-ODU processing unit 118 outputs the extracted client signal to the client signal processing unit 120.

The LO-ODU processing unit 122 according to the present embodiment accepts an input of the ODU frame from the DeMUX unit 217. The LO-ODU processing unit 122 demaps (extracts) the client signal from the ODU frame. The LO-ODU processing unit 122 outputs the extracted client signal to the client signal processing unit 124.

The error correction unit 219 includes a buffer unit 219a and an FEC decoder 219b.

The buffer unit 219a accepts an input of the C-FEC code from the DeMUX unit 217, and temporarily stores the accepted C-FEC code.

The FEC decoder 219b refers to the buffer unit 219a and decodes the C-FEC code. The FEC decoder 219b corrects an error of the client signal input to the client signal processing unit 120 and the client signal processing unit 124 by using the decoded C-FEC code. The FEC decoder 219b is an example of the second correction unit.

Next, the process performed by the transmission apparatus 200 according to the second embodiment is described below. FIG. 7 is a sequence diagram illustrating a flow of the process performed by the transmission apparatus according to the second embodiment.

As illustrated in FIG. 7, the free space detection unit 101 of the transmission apparatus 200 accepts an input of a detection command from the management apparatus 10 (S201). The free space detection unit 101 acquires the transmission rate of the ODU frame from the detection command. The free space detection unit 101 calculates the free space by subtracting the acquired transmission rate of ODU frames from the transmission rate of the payload area of the OTU frame (S202). When no free space is found in the payload area of the OTU frame, that (the answer to S203 is No), the free space detection unit 101 waits.

On the other hand, when a free space is found in the payload area of the OTU frame, (the answer to S203 is Yes), the free space detection unit 101 sends a detection notification to the FEC generation unit 205 and the MUX unit 210 to notify that the free space has been detected (S204).

When the buffer unit 205a of the FEC generation unit 205 accepts an input of the detection notification from the free space detection unit 101, the buffer unit 205a temporarily stores a plurality of client signals (S205). In the present embodiment, the client signal input from the client signal processing unit 103 and the client signal input from the client signal processing unit 107 are stored separately in the buffer unit 205a.

When the FEC encoder 205b accepts an input of the detection notification from the free space detection unit 101, the FEC encoder 205b refers to the buffer unit 205a and reads out the two separately-stored client signals (S206). The FEC encoder 205b combines together the two client signals (S207).

Thereafter, the FEC encoder 205b generates a C-FEC code using bits arranged in a column direction of bits arranged in an integrated signal obtained by combining together the two client signal (S208). The FEC encoder 205b outputs the generated C-FEC code to the MUX unit 210 (S209).

When the MUX unit 210 accepts an input of the detection notification from the free space detection unit 101, the MUX unit 210 accepts an input of the C-FEC code from the FEC encoder 205b. The MUX unit 210 multiplexes ODU frames into the payload area of the OTU frame (S210). The MUX unit 210 maps the C-FEC code into the free space of the payload area of the OTU frame (S211).

The MUX unit 210 outputs the OTU frame including the ODU frames multiplexed in the payload area and also including the C-FEC code mapped in the free space, that is, the multiplexed frame to the FEC encoder 112 via the HO-OTU processing unit 111 (S212).

The FEC encoder 112 generates an F-FEC code using bits arranged in a row direction of bits arranged in the multiplexed frame, and adds the generated F-FEC code to the multiplexed frame (S213). The FEC encoder 112 outputs the multiplexed frame, including the C-FEC code mapped in the free space of the payload area and also including the added F-FEC code, to the transmission interface unit 113 (S214).

The transmission interface unit 113 converts the multiplexed frame, including the C-FEC code mapped in the free space of the payload area and also including the F-FEC code, from an electric signal to an optical signal. The transmission interface unit 113 transmits the resultant converted multiplexed frame to the adjacent transmission apparatus (S215).

As described above, in the transmission apparatus 200 according to the second embodiment, when a payload area of an OTU frame has a free space, a plurality of client signals are combined together. The transmission apparatus 200 generates a C-FEC code using bits arranged in the resultant combined signal. The transmission apparatus 200 maps the C-FEC code in the free space. Thus, in the transmission apparatus 200 according to the present embodiment, it is allowed not to generate a different C-FEC code individually for each type of a client signal, which results in an improvement in efficiency of the error correction capability.

In the first and second embodiments described above, the transmission apparatus includes, by way of example, the free space detection unit 101 configured to detect a free space in a payload area of an OTU frame. However, the free space detection unit 101 may be removed depending on a use situation. For example, the free space detection unit 101 may be removed in a situation in which management information in a header of an OTU frame includes pre-embedded information indicating an amount of free space.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A transmission apparatus comprising:
   a mapping unit configured to map a client signal received from a client apparatus into a first frame;
   a detection unit configured to detect a free space indicating an area which is unoccupied by the first frame from a payload area of a second frame into which the first frame is mapped; and
   wherein the mapping unit is configured to:
      map the first frame into the payload area of the second frame, and
      map a first error correction code for detecting an error of the client signal into the free space of the second frame, when the free space is detected;
   an addition unit configured to add a second error correction code for detecting an error of the second frame to the second frame into which the first frame and the first error correction code are mapped; and
   a transmission unit configured to transmit the second frame to which the second error correction code is added.

2. The transmission apparatus according to claim 1, wherein
   the payload area includes multiplexed first frames, at least one of the first frames including a client signal and a respective first error correction code associated with correcting an error of the client signal; and
   the transmission unit configured to transmit the second frame including the first error correction code and the second error correction code associated with correcting the error of the second frame.

3. The transmission apparatus according to claim 2, comprising:
   a generation unit configured to generate the respective first error correction code using bits arranged in the client signal depending on a type of the client signal.

4. The transmission apparatus according to claim 3, wherein in a case where the type of client signal is a predetermined type, the generation unit stops the generation of the respective first error correction code.

5. The transmission apparatus according to claim 4, wherein the predetermined type is audio data.

6. The transmission apparatus according to claim 3, wherein the generation unit generates the respective first error correction code by using bits arranged in a predetermined direction of bits arranged in the client signal.

7. The transmission apparatus according to claim 6, comprising:
   an addition unit configured to generate the second error correction code using bits arranged in a direction different from the predetermined direction of bits arranged in the second frame, and add the generated second error correction code to the second frame.

8. The transmission apparatus according to claim 2, comprising:
a generation unit configured to combine a plurality of client signals and generate corresponding first error correction code using bits arranged in a signal obtained by combining the plurality of client signals.

9. The transmission apparatus according to claim 1, wherein the first frame is an optical-channel data unit (ODU) frame, and the second frame is an optical-channel transport unit (OTU) frame.

10. The transmission apparatus according to claim 1, wherein the addition unit is configured to add the second error correction code to the second frame so that the second error correction code becomes adjacent to the first error correction code.

* * * * *